United States Patent [19]
Sheng

[11] 3,936,755
[45] Feb. 3, 1976

[54] PROXIMITY SWITCH CIRCUIT

[75] Inventor: Abel Ching Nam Sheng, Morris Plains, N.J.

[73] Assignee: RCA Corporation, New York, N.Y.

[22] Filed: July 19, 1974

[21] Appl. No.: 490,010

[52] U.S. Cl................................ 328/5; 307/235 K
[51] Int. Cl.²......................................... G08B 13/26
[58] Field of Search.............. 328/5; 307/308, 235 K

[56] References Cited
UNITED STATES PATENTS

| | | | |
|---|---|---|---|
| 3,255,380 | 6/1966 | Atkins et al. | 328/5 X |
| 3,564,346 | 2/1971 | Atkins | 307/308 |
| 3,731,205 | 5/1973 | Gardner | 328/5 |
| 3,757,143 | 9/1973 | Muller | 307/308 X |

Primary Examiner—John S. Hayman
Attorney, Agent, or Firm—H. Christoffersen; S. Cohen; R. G. Coalter

[57] ABSTRACT

An input terminal is quiescently biased to a voltage closer to the initial threshold setting of a first comparator than to that of a second comparator. In response to the proximity of an object, an alternating voltage is induced on this terminal of an amplitude to actuate only the first comparator. Each time a comparator is actuated, a two state circuit changes the threshold settings of the comparators to bring the one formerly outside of the range of the alternating voltage to within its range and vice versa.

7 Claims, 6 Drawing Figures

PROXIMITY SWITCH CIRCUIT

This invention relates to switching circuits and particularly to alternate action proximity switches.

Proximity switches, as that term is used here, refers to that class of switches activated by bringing a body into close proximity to or in contact with a sensor. Some prior art proximity switches employ oscillators which are detuned by the presence of the body. The change in frequency is then detected to provide a switch output signal. Such switches suffer the disadvantage of requiring resonant circuits which are bulky, expensive and are a source of undesirable radiation of high frequency electromagnetic energy.

Other switches are known which employ as interleaved grid of conductors which, when touched, permit a flow of current between these conductors. Such switches are not, as the term is used here, true proximity switches since actual physical contact with a conductive member is required. This represents a possible shock hazard and has the further disadvantage of requiring a relatively complex and expensive sensor (i.e, the conductive grid).

Still other proximity switches are known which sense changes in a power line radiated electric field to detect the presence of a body. Customarily, such switches comprise a high gain amplifier, the output of which is connected to a detector. The amplifier input is connected to a sensor such as a metallic plate and the gain is adjusted to a value slightly less than necessary, under ambient field conditions, to trigger the detector. When the plate is touched, the additional signal provided by the change in plate capacitance is sufficient to trigger the detector.

This latter form of proximity switch has the virtue of simplicity, as compared with the former two, but is particularly sensitive to noise pick-up. In order to provide reliable circuit operation it is customary to reduce the amplifier gain or detector threshold but this also decreases the switch sensitivity. Further, gain variations in the amplifier (which may occur, for example, with changes in circuit supply voltage or due to ageing of the circuit components) may result in a change in the switching threshold which is unpredictable. This problem is compounded even further where it is desired to provide alternate action switching by connecting the switch output terminal to a memory element such as a flip-flop. In such an application, not only is the switching threshold unpredictable as the amplifier gain changes, but the switch state itself is unpredictable.

A need exists for a proximity switch operable upon the sensed ambient alternating field principle but having a threshold level relatively insensitive to amplifier gain variations. A further need exists for such a switch tolerant of relatively high levels of noise and capable of alternate action switching. The present invention is directed to meeting these needs.

Embodiments of the present invention include a node for receiving an input signal of amplitude $V_y$, the node being normally biased at a quiescent level $V_x$. Two threshold circuits are connected to the node. One of the threshold circuits is at an initial threshold setting closer to $V_x$ than $V_y$ and the other at an initial threshold setting further from $V_x$ than $V_y$. A further circuit, responsive to the activation of the one threshold circuit upon application of the input signal to the node, places the one threshold circuit at a new threshold setting further from $V_x$ than $V_y$ and places the other threshold circuit at a new threshold setting closer to $V_x$ than $V_y$. The further circuit, then, is responsive to a subsequent actuation of the other threshold circuit for returning the two threshold circuits to their initial threshold settings.

The invention is illustrated in the accompanying drawings wherein like reference numbers designate like elements and in which.

Figure 1:
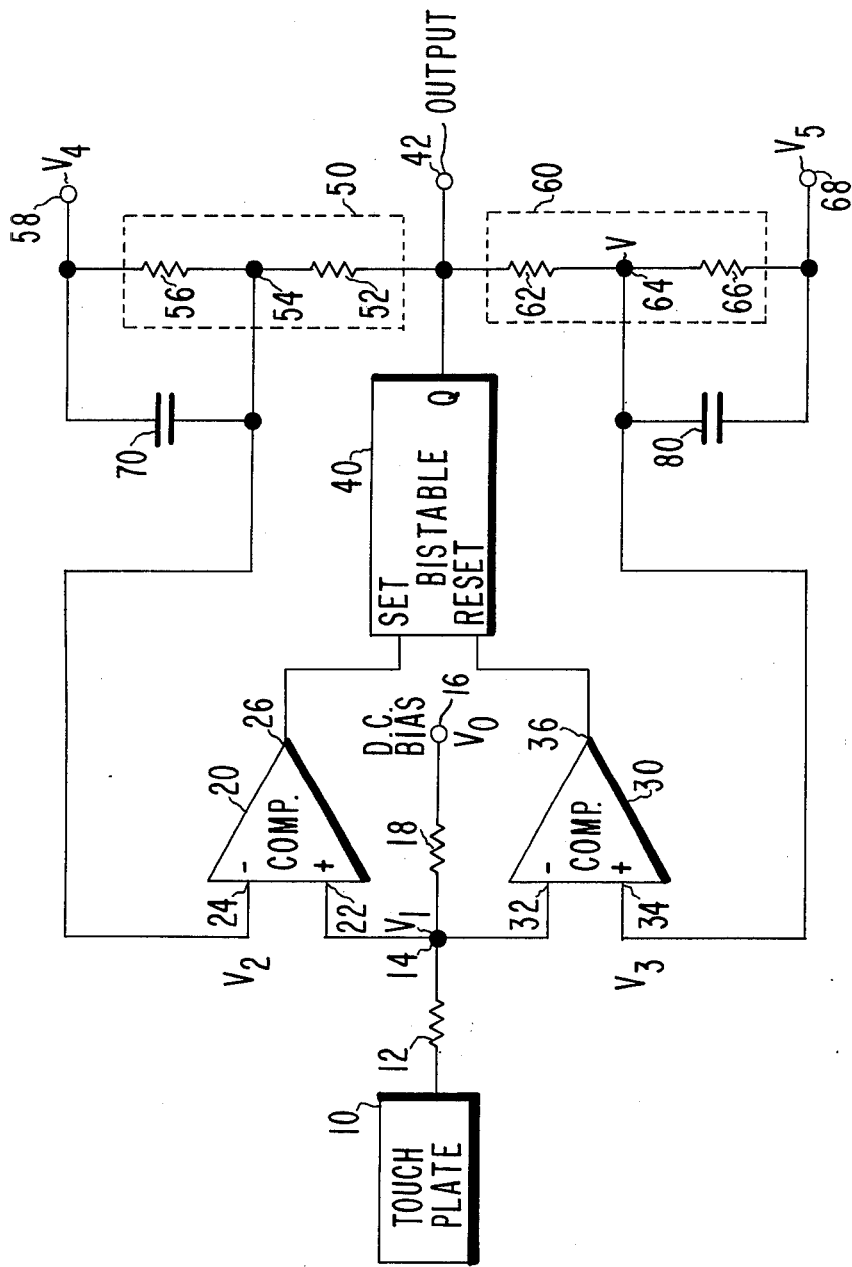
FIG. 1 is a block diagram of an alternate action touch-plate switch embodying the invention.

In FIG. 1 touch plate 10 is of a conductive material which is preferably covered on at least one face with an insulating material. The purpose of the insulation, as will be explained, is to minimize the possibility of shock hazard to one touching the plate. This possibility may be further minimized by including a current limiting resistor 12 in the connection between touch plate 10 and circuit input terminal 14. Where the touch plate is remotely located from the proximity switch, it preferred that the interconnection be made by a grounded shielded cable (not shown) for minimizing the effects of noise pick-up and localizing the switch responsive area to that of the plate. Although a rectangular plate has been shown, other suitable geometric forms may be employed instead. It may be, for example, an ornamental object such as a statue or it may be simply a wire or a terminal.

Reference terminal 16 which receives a direct current potential ($V_o$), is coupled to input terminal 14 by resistor 18. The purpose of this connection is to bias terminal 14 quiescently at this same potential (no direct current flows in the quiescent condition of the circuit) while allowing dynamic variations of its potential when plate 10 is touched. The potential at terminal 14 (the sum of the A.C. and D.C. potential) is $V_1$.

Terminal 14 is also connected to non-inverting input terminal 22 of comparator 20 and inverting input terminal 32 of comparator 30. Potentials $V_2$ and $V_3$ are applied, respectively, to inverting input terminal 24 of comparator 20 and non-inverting input terminal 34 of comparator 30. Thus connected, comparator 20 provides a positive output signal at its output terminal 26 when the potential of input terminal 14 is more positive than potential $V_2$. Conversely, when the potential of terminal 14 is more negative than potential $V_3$, comparator 30 produces a positive output signal.

The comparators provide dead zone detection of the input signal for rejecting noise and (due to feedback effects discussed below) pulse steering to memory element 40 for achieving alternate action switching. These comparators are preferably high gain differential amplifiers but the circuit operation does not depend on the magnitude of the gain as long as it is at least a minimum value and there is no requirement that the gains be equal. This is an advantage over prior art proximity switches which require stable amplifier gains to determine switching thresholds. As will be described in detail later, the switching threshold of the present switch is determined by a voltage divider network and is a time dependent function.

Bistable circuit 40 is connected at the SET and RESET input terminals thereof to the output terminals of comparators 20 and 30, respectively. Its purpose is to provide the "memory" essential to achieving alternate action switching. Although this element could be implemented by mechanical means (such as latching relays) or purely passive electrical means (such as a low-loss storage capacitor or a magnetic core element) it is preferred that it comprise active electronic switching devices so that the elements described thus far (comparators 20 and 30 and bistable 40) may be integrated upon a single monolithic substrate. An example of a fully integrated combination of two comparators and a bistable suitable for use in the present invention is described in a United States patent application (U.S. Ser. No. 320,634) entitled "Comparator Circuitry" which was filed by A. A. A. Ahmed on Jan. 2, 1973, and is assigned to the assignee of the present invention.

The output of bistable 40 is connected to a circuit output terminal 42 and to a pair of voltage translating circuits 50 and 60. The purpose of the voltage translating circuits is to provide the reference voltages $V_2$ and $V_3$ which are, respectively, more positive and more negative than the bias voltage $V_o$ applied to input terminal 16. These circuits may be either of the constant potential kind (as those employing Zener diodes or one or more series connected forward biased diodes, not shown) or the resistance ratio kind. The latter form is illustrated in the preferred embodiment and has the advantage that the translated voltage (offset potential) may be adjusted to a desired value by selection of a resistance ratio or, in the alternative, a reference potential. The constant potential voltage translator, while not easily programmable, has the advantage of not requiring precise reference voltages.

Voltage translation circuit 50 comprises a resistor 52 connected between output terminal 42 and circuit point 54. This circuit point is connected to input terminal 24 of comparator 20 and to reference terminal 58 which receives a reference potential $V_4$ that is more positive than bias potential $V_o$. The ratio of resistors 52 and 56 and the value of potential $V_4$ are selected to be such that the translated signal ($V_2$) for either state of bistable 40 is never more negative than bias potential $V_o$.

Voltage translation circuit 60 comprises a resistor 62 connected between output terminal 42 and circuit point 64. This point is connected to input terminal 34 of comparator 30 and to reference terminal 68 which receives reference potential $V_5$ that is more negative than potential $V_o$. Here, the resistor values and potential $V_5$ are selected such that the translated reference potential $V_3$ is never more positive than potential $V_o$ for either state of bistable 40.

Figure 4:
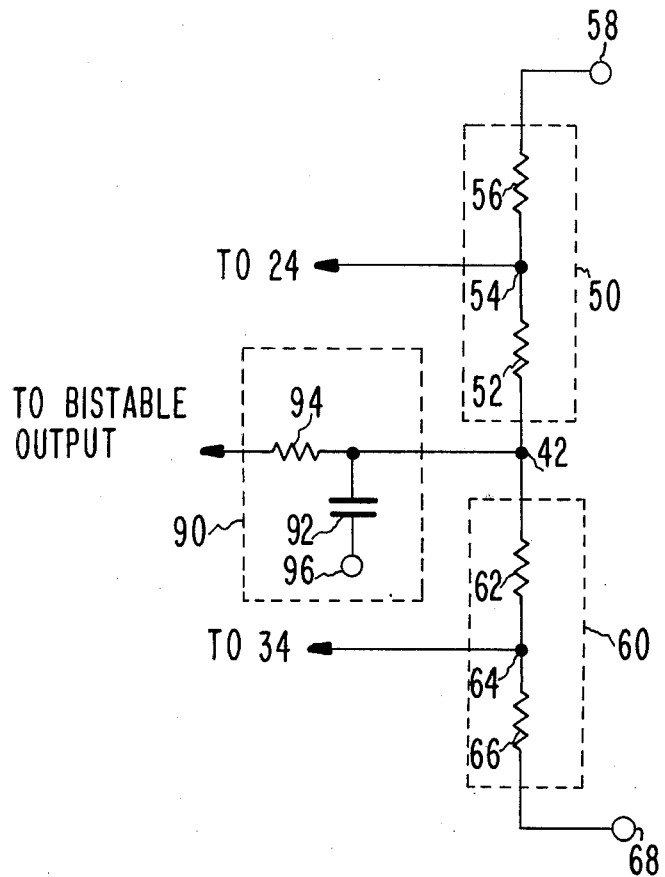
FIGS. 4 and 5 illustrate modifications of the switch of FIG. 1.

Capacitors 70 and 80, connected in parallel with resistors 56 and 66, respectively, provide the delay necessary to achieve alternate action switching. Although two capacitors are shown in FIG. 1, one capacitor is sufficient as indicated in FIG. 4 and discussed subsequently.

Stated briefly, overall circuit operation is as follows.

A power supply (not shown) provides direct current operating potentials to the switch. In addition to receiving these direct potentials, a suitable terminal (such as one of 68, 16 or 58) of the switch is coupled to either the high side or low side (ground) of an A.C. power line. Normally, plate 10 will pick up a relatively small A.C. signal (and noise) but the values of the circuit potentials and resistance ratios are selected such that the sum of the plate output signal and the direct current bias ($V_1$) which appears at input terminal 14 is within the "dead zone" ($V_2 - V_3$) of comparators 20 and 30 when plate 10 is untouched.

The comparator reference voltages ($V_2$, $V_3$) are asymmetrically related to the D.C. reference voltage ($V_1$). Touching plate 10 results in a capacitance change which causes an increase of the A.C. signal sufficient to be detected by one of the comparators and its output signal changes the state of bistable 40. Delayed feedback (provided by elements 50, 60, 70 and 80) is of a sense to reverse the symmetry of the comparator threshold levels relative to D.C. potential $V_1$ as discussed in more detail below. This delayed symmetry reversal assures that the next time plate 10 is touched, the other comparator will trigger bistable 40 to its initial state. If the plate is touched for a period longer than the delay period, astable operation results.

Figure 2:
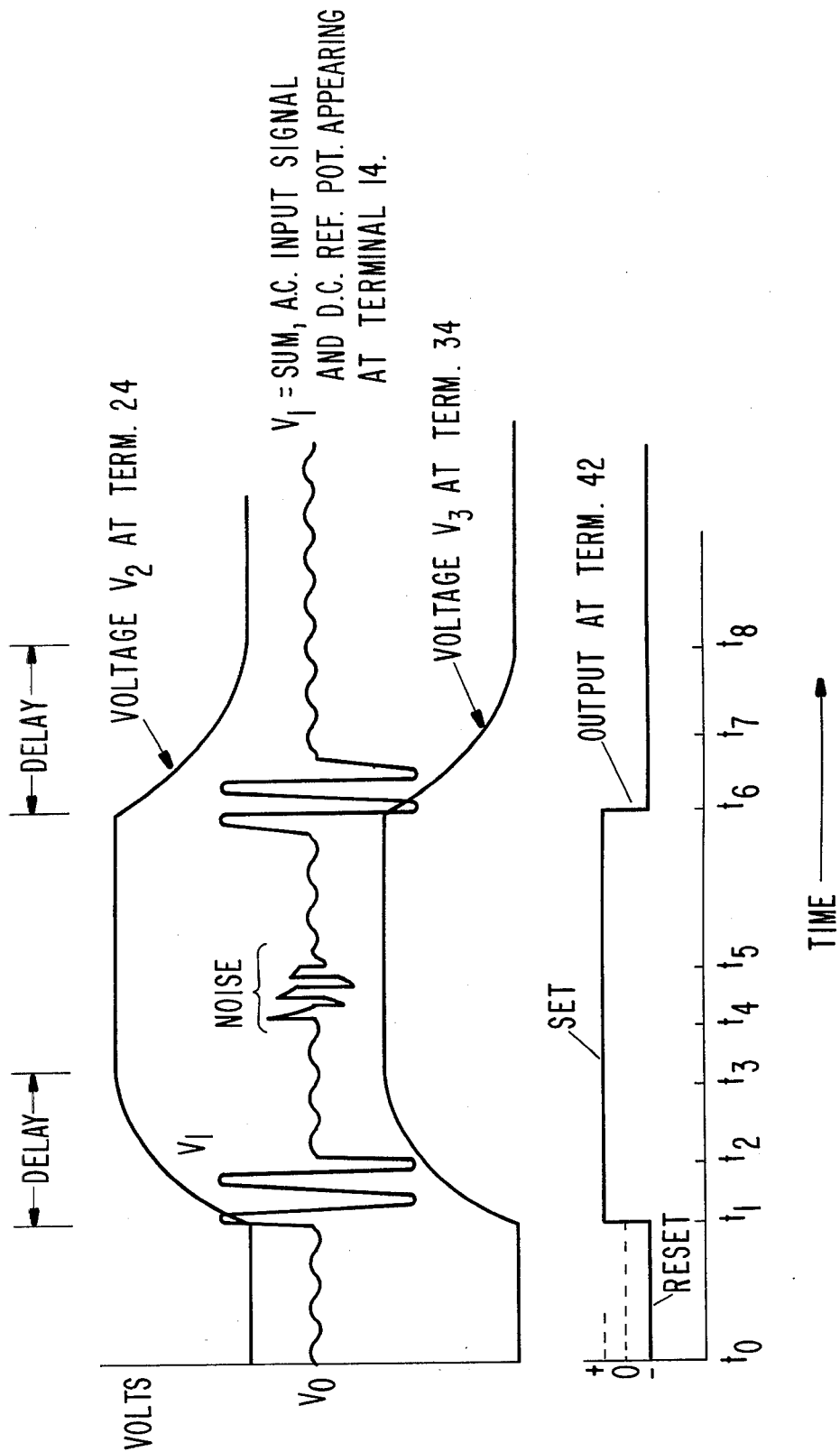
FIGS. 2 and 3 illustrate signal waveforms associated with the embodiment of FIG. 1.

The above brief statement of circuit operation is illustrated in more detail by the waveforms of FIG. 2 which shows the bistable state, the comparator threshold voltages ($V_2$ and $V_3$) and the A.C. signal $V_1$ provided by touch plate 10. (These potentials are relative to the D.C. bias potential, $V_o$). Time intervals $t_0 - t_8$ illustrate a complete cycle of the switch operation (i.e., alternate action switching).

During time interval $t_0-t_1$ bistable 40 is in a reset condition providing a negative output voltage at output terminal 42 (relative to $V_o$). This potential, applied to voltage translating circuits 50 and 60 causes the threshold of comparator 20 to be slightly more positive and the threshold of comparator 30 to be substantially more negative than the potential of terminal 14. Plate 10, during this interval is assumed untouched but, due to the capacitive coupling effects previously discussed, it applies a relatively small A.C. signal (and noise) to terminal 14. The circuit operating potentials and resistance ratios are selected such that this signal is inadequate to trigger comparator 20 so that the switch remains in a stable, quiescent condition.

During time interval $t_1 - t_2$ plate 10 is touched increasing the A.C. signal sufficiently to trigger comparator 20 which sets bistable 40. The latter's output voltage changes from a negative to a positive value and, due to the delay provided by capacitors 70 and 80, the comparator threshold voltages $V_2$ and $V_3$ slowly change to the values indicated at time $t_3$. The threshold voltage $V_2$ of comparator 20 at time $t_3$ is substantially more positive and that $V_3$ of comparator 30 slightly more negative than potential $V_1$. This is reversed from the previous condition and this change in threshold levels provides the trigger pulse steering to bistable 40 that is essential to achieve alternate action switching. The next time plate 10 is touched (time $t_6$), comparator 30 will be triggered since its threshold voltage $V_3$ is then more nearly equal to the A.C. input signaL.

Figure 3:
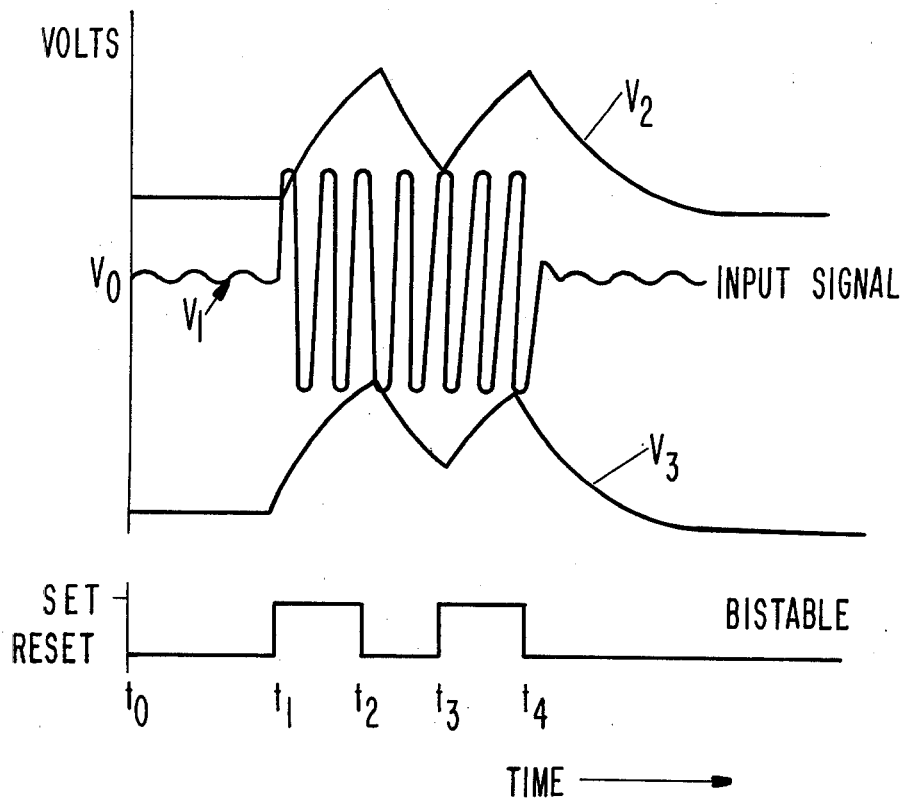

FIG. 3 illustrates a feature of the invention by which astable circuit operation is achieved by touching plate 10 for a period of time long compared to that of the previous example. This action results because the thresholds change after each change of state of bistable 40 ($t_1 - t_4$) in a sense to return the bistable to its previous state. The period of this cyclic action is a function of the delay caused by capacitors 70 and 80, the operating potential values, the resistance ratios and the magnitude of the A.C. signal. As a practical matter (such as where the switch is used to provide on-off control of room lights) it is preferred that the delay be selected to be relatively long compared to the average physical reaction time of the person touching the switch. In such lamp control applications a delay of a few hundred milliseconds will be adequate for people having normal reaction times. This delay, of course, may be substantially longer or shorter to suit the reactions of particular persons or as needed in other switching applications.

Thus, the proximity switch of the present invention is capable of two modes of operation. By touching plate 10 for a relatively short period of time "touch-on, touch-off" switching action is obtained. Conversely, touching plate 10 for longer periods produces astable (oscillatory) switching action.

FIG. 4 illustrates that the delay provided in FIG. 1 by capacitors 70 and 80 may be obtained by use of a single capacitor 92. Capacitors 70 and 80 are removed from the circuit and terminal 42 is connected to the output terminal of bistable 40 by resistor 94. Capacitor 92 connected between terminal 42 and a reference point 96 delays the output signal produced by bistable 40. Voltage translating circuits 50 and 60 translate the delayed output signal to higher and lower voltage levels and the circuit operation is as previously discussed.

Figure 5:
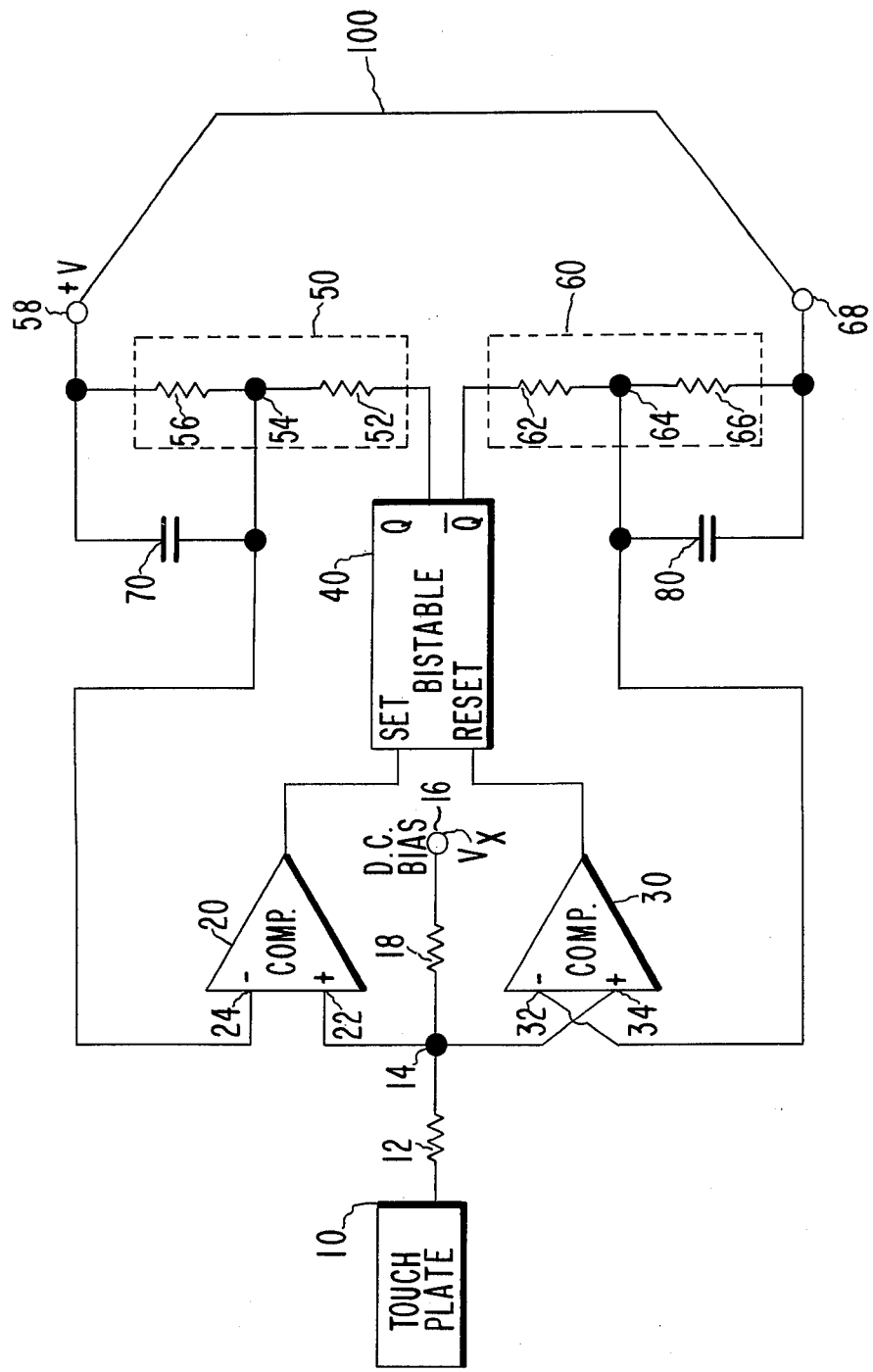

The circuit of FIG. 5 illustrates a modification of the proximity switch of FIG. 1 in which comparator 30 is connected as a positive threshold detector and voltage translation circuit 60 is arranged to produce a positive output signal that is complementary to that produced by voltage translation circuit 50. These changes result in the threshold levels of comparators 30 and 20 being of the same polarity (though of different magnitudes) with respect to the D.C. bias potential applied to circuit input terminal 16 (here denoted by $V_x$).

The modification comprises reversing the connections to terminals 32 and 34 of comparator 30, connecting resistor 62 to the $\overline{Q}$ rather than the Q output of bistable 40 and connecting terminal 58 to terminal 68 by a conductor 100 so that those terminals receive a common operating potential +V. The Q and $\overline{Q}$ signal produced by bistable 40 are complementary and vary between zero and +V volts.

Figure 6:
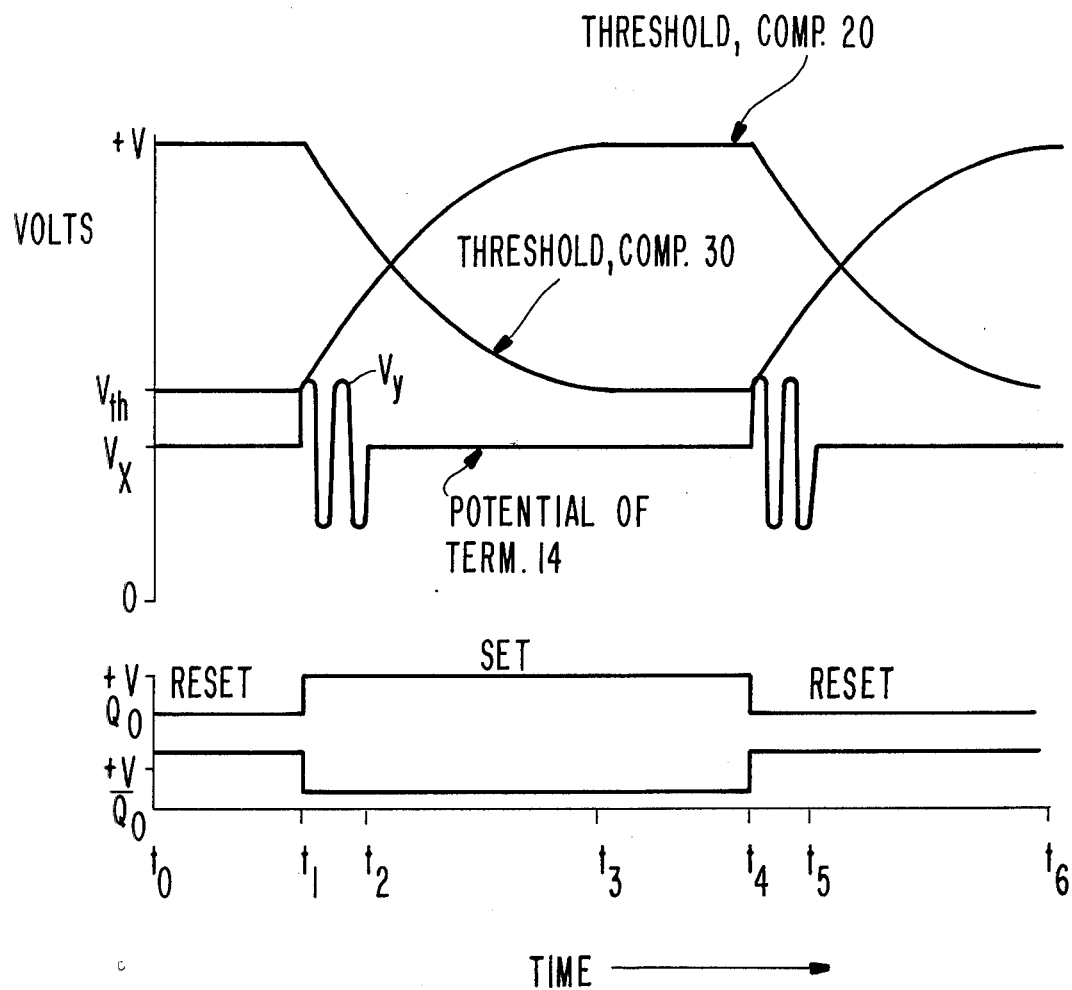
FIG. 6 illustrates signal waveforms of the modified switch of FIG. 5.

As illustrated by the signal waveforms of FIG. 6, the operation of the modified switch is substantially the same as that previously described except that the threshold signal for comparator 30 is now of the same polarity and complementary to that of comparator 20.

In more detail, circuit input terminal 14 is biased at a quiescent potential $V_x$. Potential $V_y$ represents the amplitude of the alternating signal produced when plate 10 is touched. As seen in FIG. 6, under quiescent conditions (time interval $t_o$ - $t_1$) the threshold setting of comparator 20 is closer to potential $V_x$ than $V_y$ and the threshold setting of comparator 30 is at a potential further from $V_x$ than $V_y$. At time $t_1$, when plate 10 is touched, comparator 20 (having the closer threshold setting) is activated which sets bistable 40 thereby reversing the relative magnitudes of the potentials at its Q and $\overline{Q}$ output terminals. This causes the voltage translating circuits 50 and 60 to place comparator 20 at a new threshold setting further from $V_x$ than $V_y$ and to place comparator 30 at a new threshold setting closer to $V_x$ than $V_y$. Thus, when plate 10 is next touched (time $t_4$) comparator 30 will be activated which will reset bistable 40 and thus return the comparators to their initial threshold settings. As in the previous example, touching plate 10 for a period of time longer than the delay period provided by capacitors 70 and 80 results in astable circuit operation.

What is claimed is:

1. The combination of:
    input means normally at a given quiescent bias level $V_x$ and responsive to the proximity of an object for producing an alternating output signal of amplitude $V_y$;
    two variable threshold circuits connected to said input means, one at an initial threshold setting closer to $V_x$ than $V_y$ and the other at an initial threshold setting further from $V_x$ than $V_y$; and
    circuit means responsive to the actuation of said one threshold circuit in response to said alternating output signal for changing the threshold of said one threshold circuit to a new threshold setting further from $V_x$ than $V_y$ and for changing the threshold of said other threshold circuit to a new threshold setting closer to $V_x$ than $V_y$, and responsive to subsequent actuation of said other threshold circuit for returning said two threshold circuits to their initial threshold settings.

2. The combination recited in claim 1 further comprising delay means in said circuit means for delaying the change in the threshold setting of each of said threshold circuits for a period of time not less than one period of said alternating signal.

3. The combination recited in claim 2 wherein said two threshold circuits comprise:
    first and second comparators each having two input terminals and an output terminal, one input terminal of each comparator being connected to said input means, the other input terminal of each comparator for receiving a separate threshold control signal, each comparator producing an output signal at its output terminal indicative of the relative sense of the signals applied to its input terminals.

4. The combination recited in claim 3 wherein said circuit means comprises:
    bistable means having first and second states and input means in said bistable means for placing said bistable means in a selected one of its states in response to signals supplied thereto;
    means coupling said output terminals of said first and second comparators to said input means of said bistable means;
    means responsive to the state of said bistable means for producing first and second ones of said threshold control signals, one of said control signals being closer to $V_x$ than the other when said bistable is in one of its states, the other of said control signals being closer to $V_x$ than the one when said bistable is in the other of its states; and
    means for applying said first threshold control signal to said other input terminal of said first comparator and said second threshold control signal to said other input terminal of said second comparator.

5. In combination:
    a circuit input terminal for receiving a momentarily applied alternating current input signal, said input terminal being quiescently biased at a given potential;
    comparator means coupled to said input terminal and responsive to first and second variable threshold control signals for producing a first output signal when the value of said input signal exceeds the value of said first threshold control signal and for producing a second output signal when the value of said input signal exceeds the value of said second threshold control signal;

bistable means coupled to said comparator means and responsive to said first and second output signals for being placed in first and second states, respectively;

circuit means responsive to the state of said bistable means for controlling the values of said threshold control signals such that one of said threshold control signals is closer to said given potential when said bistable is set and the other of said control signals is closer to said given potential when said bistable is reset; and delay means coupled to said circuit means for delaying a change in the values of said threshold control signals for a predetermined time after a change in state of said bistable means has occurred.

6. The combination recited in claim 5 further comprising:

input means coupled to said circuit input terminal and responsive to the proximity of an object for producing said alternating current input signal.

7. The combination recited in claim 6 wherein said predetermined time is at least one period of said alternating current signal.

* * * * *